United States Patent
Tohyama

[19]

[11] Patent Number: 6,018,169
[45] Date of Patent: Jan. 25, 2000

[54] SOLID-STATE IMAGE SENSOR AND METHOD OF FABRICATING THE SAME

[75] Inventor: Shigeru Tohyama, Tokyo, Japan

[73] Assignee: NEC Corporation, Tokyo, Japan

[21] Appl. No.: 09/019,470

[22] Filed: Feb. 5, 1998

[30] Foreign Application Priority Data

Feb. 7, 1997 [JP] Japan .................................. 9-024956

[51] Int. Cl.[7] ................................................. H01L 27/148
[52] U.S. Cl. ........................................ 257/222; 257/215
[58] Field of Search ..................... 257/222, 215

[56] References Cited

U.S. PATENT DOCUMENTS 4,242,694  12/1980  Keike et al. .

FOREIGN PATENT DOCUMENTS 62277878  12/1987  Japan ............................. H04N 9/07
63500412  2/1988  Japan ............................. H01L 27/14

OTHER PUBLICATIONS

"Properties of Rutile (Titanium Dioxide)" F.A. Grant; *Reviews of Modern Physics,* vol. 31, No. 3, 1959; pp. 646–674.

"Electrical and optical properties of $TiO_2$ anatase thin films" Tang et al; vol. 75, No. 4, 1994; Journal of Applied Physics; pp. 2042–2047.

"Transparent Metal Oxide Electrode CID Imager" Brown et al; IEEE Journal of SOlid–State Circuits, vol. SC–11, No. 1, Feb. 1976; pp. 128–132.

"Buried–Channel CCD Imaging Arrays with Tin–Oxide Transparent Gates" McCann et al; IEEE International Solid–State Circuites Conferences; Feb. 15, 1978; pp. 30–31 and pp. 261–262.

"A Tin Oxide Transparent–Gate Buried–Channel Virtual–Phase CCD Imager" Deenan et al IEEE Transactions on Electron Devices, vol. ED–32, No. 8; Aug. 1985; pp. 1531–1533.

*Primary Examiner*—Stephen D. Meier
*Attorney, Agent, or Firm*—Hayes Soloway Hennessey Grossman & Hage PC

[57] ABSTRACT

There is provided a solid-state image sensor including a photodetector array in which a plurality of photodetectors are one- or two-dimensionally arranged, each one of the photodetctors including an electrode in a photoelectric conversion region, and transmitting signals when detecting a light passing through the electrode, the solid-state image sensor converting the signals into time sequence electric signals, the electrode being composed of titanium dioxide ($TiO_2$). The titanium dioxide preferably contains oxygen vacancies or at least one of tungsten (W), phosphorus (P), antimony (Sb), tantalum (Ta), niobium (Nb), indium (In) and oxides thereof ($WO_3$, $P_2O_5$, $Sb_2O_5$, $Ta_2O_5$, $Nb_2O_5$, $In_2O_3$). The above-mentioned solid-state image sensor provides a high quantum efficiency which would be obtained when transparent, electrically conductive material such as ITO ($In_2O_3$—$SnO_2$) and tin oxide ($SnO_2$) is used. In addition, the solid-state image sensor enhances designability and productivity, since it has no limitation in fabrication which would exist when the above-mentioned transparent, electrically conductive material is used.

26 Claims, 6 Drawing Sheets

SOLID-STATE IMAGE SENSOR AND METHOD OF FABRICATING THE SAME

BACKGROUND OF THE INVENTION

1. Field of the Invention

The invention relates to a solid-state image sensor to be employed in a visible radiation region, and a method of fabricating the same.

2. Description of the Related Art

As a solid-state image sensor including a photodetector having electrodes in a photoelectric conversion region and detecting a light passing through the electrode, there are a charge coupled device (CCD) which is one-dimensionally fabricated, a charge injection device (CID) image sensor, a time delay and integration (TDI) operation CCD image sensor, a frame transfer type CCD image sensor, and a full-frame type CCD image sensor.

In a CID image sensor, photoelectric conversion is carried out at a portion below a gate electrode of a MOS capacitor. In a one-dimensional CCD, TDI operation CCD image sensor, a frame transfer type CCD image sensor, and a full-frame type CCD image sensor, a CCD having a function of electronic scanning is employed also as a photodetector.

FIG. 1 illustrates a basic structure of CID image sensor, and FIGS. 2A to 2C illustrate an operation of a unit pixel of a CID image sensor. A unit pixel 13 illustrated in FIG. 1 is constituted of two charge-coupled MOS capacitors, as illustrated in FIGS. 2A to 2C. In a CID image sensor, a plurality of unit pixels 13 is two-dimensionally arranged. Each one of the unit pixels 13 is electrically connected with one of horizontal selection lines 16 and further with one of vertical selection lines 17. All the horizontal selection lines 16 are connected to a vertical shift register 14, and all the vertical selection lines 17 are connected to a horizontal shift register 15. An individual unit pixel among a plurality of the unit pixels 13 is accessible by means of a horizontal selection pulse applied to one of the horizontal selection lines 16 and a vertical selection pulse applied to one of the vertical selection lines 17. Hereinbelow, an operation for selecting one of the unit pixels 13 is explained with reference to FIGS. 2A to 2C.

As illustrated in FIG. 2A, the unit pixel 13 is comprised of a p-type Si substrate 18 which is grounded, an oxide film 21 formed on the substrate 18, a first gate electrode 19 formed on the oxide film 21 and electrically connected to the horizontal selection line 16, and a second gate electrode 20 formed partially on the oxide film 21 and partially on the first gate electrode 19 with the oxide film 21 sandwiched therebetween, and electrically connected to the vertical selection line 17.

FIG. 2A illustrates a condition where high level is applied to the horizontal selection line 16 and low level is applied to the vertical selection line 17. There is formed a potential well W in the p-type silicon substrate 18 below the first gate electrode 19 electrically connected to the horizontal selection line 16. Signal charges generated in the p-type Si substrate 18 by means of a light h υ passing through the first and/or second gate electrodes 19 and 20 and incident on the substrate 18 are accumulated in the potential well W.

FIG. 2B illustrates a condition where low level is applied to the horizontal selection line 16 and high level is applied to the vertical selection line 17. In this case, a potential well W is formed in the p-type silicon substrate 18 below the second gate electrode 20 electrically connected to the vertical selection line 17. Signal charges generated by an incident light h υ are accumulated in the potential well W.

As mentioned above, if at least one of MOS capacitors electrically connected to the horizontal and vertical selection lines 16 and 17 is in high level, signal charges are accumulated in one or both of the potential well(s) W formed below the first and second gate electrodes 19 and 20, or merely move between the two MOS capacitors, and do not flow out of the substrate 18.

To the contrary, if low level is applied to both horizontal and vertical selection lines 16 and 17, the potential well W ceases to exist in a pixel located at an intersection of the horizontal and vertical selection lines 16 and 17, as illustrated in FIG. 2C. Hence, signal charges become excessive minority carriers, and resultingly are swept towards the inside of the substrate 18. The minority carriers recombine with majority carriers to thereby generate a recombination current Is running between the ground and the substrate 18. Image signals are produced, utilizing the fact that the thus generated recombination current Is is in proportion to signal charges.

Since basic photoelectric conversion mechanism is common in all image sensors including CCD itself as a photodetector, hereinbelow is explained the photoelectric conversion mechanism of a frame transfer type CCD image sensor as an example.

FIG. 3 is a plan view of a frame transfer type CCD image sensor, and FIG. 4 is a cross-sectional view of an image section of the frame transfer type CCD image sensor illustrated in FIG. 3. In the illustrated frame transfer type CCD image sensor, a vertical CCD is of the three-phase drive type. Channel stop regions 8 vertically divide a charge transfer channel into pixel rows in the same number as the number of horizontal pixels. Vertical CCDs are arranged perpendicularly to the channel stop regions 8. The vertical CCDs are grouped into upper and lower groups. The upper group of the vertical CCDs forms an image section 22 for receiving a light therein, whereas the lower group of the vertical CCDs forms a storage section 23 for temporarily storing signal charges therein. The storage section 23 is connected at a termination end thereof with a horizontal CCD 9. The horizontal CCD 9 receives signal charges of a line at a time from the storage section 23, and carries them to an output section 10. The output section 10 carries out detecting of signal charges and converting the thus detected charges into voltage, and then emits the signal voltage as an output. A thin insulating film (not illustrated) is formed over the image sensor, and a metal film (not illustrated) is formed on the insulating film in order to prevent light from entering the storage section 23 and the horizontal CCD 9.

With reference to FIG. 4, the image section of the frame transfer type CCD image sensor includes a p-type Si substrate 18, a gate oxide film 4 formed on the p-type Si substrate 18, and a plurality of vertical CCD electrodes 26 arranged on the gate oxide film 4. One of drive signals $I_{\Phi 1}$ to $I_{\Phi 3}$ is applied to every three vertical CCD electrodes 26.

As illustrated in FIG. 4, a single pixel 27 corresponds to three vertical CCD electrodes 26. Herein, a single pixel means a region surrounded by the vertical CCD electrodes 26 in the number associated with the number of phases of drive signals 24 constituting one stage of CCD and the channel stop regions 8. There are formed potential wells W below the vertical CCD electrodes 26 to which the drive signals $I_{\Phi 1}$ is applied, that is, positive charges [+] are applied. When a light having an energy of h υ is incident on a light receiving region of the image section 22, excited signal charges are collected in the potential well W below one of the three vertical CCD electrodes 26 corresponding to a single pixel 27.

When a charge accumulation period for converting a light signal into signal a charge has finished, drive signals 24 for driving the vertical CCDs in the image section 22 and drive signals 25 for driving the vertical CCDs in the storage section 23 become high-speed transfer pulses, and thus charges in all pixels in the image section 22 are immediately transferred to and stored in the storage section 23.

Thereafter, the image section 22 starts again accumulating light signal charges in each of the pixels. While the image section 22 is accumulating light signal charges, the signal charges having been stored in the storage section 23 are downwardly transferred line by line, and then are transferred to the output section 10 through the horizontal CCD 9. First, signal charges stored in the bottom line are all transmitted to the horizontal CCD 9, and then transferred horizontally to the output section 10 at a high clock frequency. The thus transferred signal charges are read out of the output section 10 as time sequential signals. Since the next signal charges have already been transferred down to the bottom line at this time, the next signal charges are transferred into the horizontal CCD 9 by next transfer operation of the storage section 23, and then read out of the output section 10.

After signal charges associated with an image have been all read out through the horizontal CCD 9, the drive signals 24 applied to the image section 22 and the drive signals 25 applied to the storage section 23 become high-speed transfer pulses again, and then the next signal charges are transferred to the storage section 23. In the same manner as mentioned above, signal charges associated with an image are successively read out pixel by pixel.

TDI operation CCD image sensors and full-frame type CCD image sensors basically have the same structure as that of the above-mentioned frame transfer type CCD image sensor except that the storage section 23 is eliminated. A TDI operation CCD image sensor scans incident thereon at a constant rate, and synchronizes transfer rate of signal charges with motion of the images to thereby concurrently carry out accumulation and transfer of signals, and provide high sensitivity. A full-frame type CCD image sensor includes a mechanical shutter in front of the CCD image sensor in order to shield the CCD image sensor from light when signal charges are read out of the CCD image sensor. When a charge accumulation period has expired, the mechanical shutter is closed. Then, signal charges are read out of the CCD image sensor for frame transfer in the same manner as signal charges are read out of the storage section of the above-mentioned frame transfer type CCD image sensor.

In the above-mentioned conventional solid-state image sensors including an electrode in a photoelectric conversion region, and a photodetector for detecting light passing through the electrode, such as a one-dimensional CCD, a CID image sensor, a TDI operation CCD image sensor, a frame transfer type CCD image sensor, and a full-frame type CCD image sensor, the gate electrode formed in a photoelectric conversion region and the CCD transfer electrode are composed of polysilicon. Hence, the conventional solid-state image sensors are accompanied with a problem that a photodetector has low quantum efficiency because of intensive absorption of light into the polysilicon electrode. In particular, a quantum efficiency is just a few percent in the blue region.

As a solution to the above-mentioned problem, various solid-state image sensors have been suggested in the followings.

1. Dale M. Brown et al., "Transparent Metal Oxide Electrode CID Imager", IEEE Journal of Solid-State Circuits, Vol. SC-11, No. 1, February 1976, pp. 128–132

2. David H. McCann et al., "Buried-Channel CCD Imaging Arrays with Tin-Oxide Transparent Gates", IEEE International Solid-State Circuits Conference Digest of Technical Papers, February 1978, pp. 30–31 and pp. 261–262

3. W. F. Keenan et al., "A Tin Oxide Transparent-Gate Buried-Channel Virtual-Phase CCD Imager", IEEE Transactions on Electron Devices, Vol. ED-32, No. 8, August 1985, pp. 1531–1533

The device suggested by D. M. Brown et al. is a CID image sensor. A structure of a unit pixel in the suggested CID image sensor is illustrated in FIG. 5. A thick field oxide film 30 is formed on an n-type silicon substrate 1. A portion of the field oxide film 30 in a region which will make an active region (namely, a recessed region inside a boundary 31 between a gate oxide film and the field oxide film 30) is removed, and a thin gate oxide film is formed in the region. In the region, a polysilicon low line (a horizontal selection line) 28 is first horizontally formed, and then a transparent electrode column line (a vertical selection line) 29 is formed on the polysilicon low line 28. The transparent electrode is composed of ITO (Indium-Tin Oxide: $In_2O_3$—$SnO_2$), that is, indium oxide containing tin oxide at 5 to 10%.

A portion of the polysilicon low line (horizontal selection line) 28 covering the gate oxide film therewith constitutes a first gate electrode, and a portion of the transparent electrode column line (vertical selection line) 29 covering the gate oxide film therewith constitutes a second gate electrode. Though the polysilicon low line (horizontal selection line) 28 absorbs a light to much degree, optical loss in the transparent electrode column line (vertical selection line) 29 is small. Thus, a quantum efficiency is enhanced by a light incident on the device through the transparent electrode column line 29.

Devices suggested by D. H. McCann et al. are a one-dimensional CCD, A TDI operation CCD image sensor, and a frame transfer type CCD image sensor. FIG. 6 illustrates a cross-sectional structure of a light-receiving region of those devices. A p-type buried channel 32 is formed in the vicinity of a surface of an n-type silicon substrate 1, and a two-layered gate insulating film comprising a thermal oxide film 33 and a silicon nitride film 34 is formed on the silicon substrate 1. A plurality of first tin dioxide electrodes 35 is formed on the silicon nitride film 34 in such a way that the adjacent electrodes 35 are spaced away from each other. A first SILOX (SiO deposited by atmospheric pressure CVD. One of hyalines) layer 36 as an insulating film covers the first tin dioxide electrodes 35 therewith. A plurality of second tin dioxide electrodes 37 is formed on the first SILOX layer 36 so that each of the second tin dioxide electrodes 37 is disposed above a space formed between the adjacent first tin dioxide electrodes 35. The second tin dioxide electrodes 37 and exposed portions of the first SILOX layer 36 are covered with a second SILOX layer 38, on which an internal wiring composed of aluminum is formed in a non-illustrated region. On the second SILOX layer 38 are deposited a third SILOX layer 39 and a fourth SILOX layer 40. A light shield composed of aluminum for defining a light receiving region is formed on the fourth SILOX layer 40 in a non-illustrated region.

Since all CCD transfer electrodes in the light receiving region are composed of tin dioxide ($SnO_2$), which is known as a transparent conductive material, the device suggested by D. H. McCann has a significantly enhanced quantum efficiency.

A device suggested by W. F. Keenan is a kind of a full-frame type CCD image sensor, but has a unique structure. This is a CCD operable by a single drive signal, and is called a virtual-phase (VP) CCD. FIG. 7 illustrates a cross-sectional structure of the suggested device. The device includes a silicon substrate 40, a gate oxide film 46 formed on the substrate 40, a plurality of tin oxide electrodes 42 formed on the gate oxide film 46 and spaced away from each other, and an oxide film 43 covering the tin oxide electrodes 42 and exposed portions of the gate oxide film 46 therewith.

As illustrated in FIG. 7, there is no vertical CCD electrode on the gate oxide film 46 between the tin oxide electrodes 42 which are driven with one drive signal. Instead of a vertical CCD electrode, boron virtual electrodes 41 are formed in the substrate 40 for keeping a surface potential in the substrate 40. The region where the boron virtual electrode 41 exists is a virtual-phase region 44, and the region where the tin oxide electrode 42 exists is a clock-phase region 45.

Though not illustrated, n-type buried channels are formed below the boron virtual electrodes 41 and the tin oxide electrodes 42. In n-type buried channels of both the virtual-phase 44 and the clock-phase 45, there are established impurities profiles which generate a difference in potential for forming both a barrier region and a storage region. Though a virtual-phase CCD is inferior in charge transfer capacity to an ordinary CCD which forms a barrier region and a storage section in CCD channel by drive signals to be applied to vertical CCD electrodes, a virtual-phase CCD provides an advantage of high quantum efficiency, because no vertical CCD electrode exists above the virtual-phase region 44. By composing vertical CCD electrodes formed on the clock-phase regions 45 of tin dioxide ($SnO_2$) in place of polysilicon of which a vertical CCD electrode in a conventional virtual-phase CCD is composed, quantum efficiency is further enhanced, and uniformity in sensitivity between pixels is also enhanced.

As mentioned above, it is possible to improve quantum efficiency of a photodetector, in particular, in the blue region, by composing a gate electrode and CCD transfer electrode in a photoelectric conversion region of ITO ($In_2O_3$—$SnO_2$) or tin oxide ($SnO_2$). However, this is accompanied with the following problems.

Indium (In) which is a major constituent of ITO and tin (Sn) which is a major constituent of tin dioxide are materials both forming all ratio solid solution along with silicon, and hence do not form a stable form. In addition, oxides of indium and tin do not have sufficiently high thermal resistance. Hence, indium and tin tend to become contaminated, and thus pose a problem that limits the fabrication process, designability, performance limits, and productivity thereof are reduced in order to avoid deterioration of performances in a device.

In particular, thermal steps are limited. As described in the report of D. M. Brown, the maximum allowable temperature to be applied to a device is about 600° C., if ITO or tin oxide were employed for forming an electrode. It would be difficult to implant and activate impurities, if an electrode were composed of ITO or tin oxide, and accordingly, it is not possible to employ self-align techniques useful for fabricating a smaller device and further for enabling a device to have higher performances. Furthermore, when an electrode is to be formed of a multi-layered structure, as having been reported by D. H. McCann, an insulating film between electrodes has to be a film which is capable of being formed at a low temperature process which would provide only low insulation. For instance, if an insulating film were to be formed of SILOX, it had to be formed at 400° C. to 450° C.

Japanese Unexamined Patent Publication No. 62-277878 has suggested a solid-state image sensor comprising a CCD type solid-state image sensor, and a micro color film disposed on the solid-state image sensor. The suggested CCD type solid-state image sensor is used for a camera, in particular, an electronic still camera, and is characterized by having means for preventing a light from entering the mage sensor.

Japanese Unexamined Patent Publication No. 63-500412, which is based on the international application numbered PCT/US86/01507 or assigned U.S. patent application Ser. No. 762,172, has suggested a frame transfer type CCD area image sensor having an improved horizontal resolution.

SUMMARY OF THE INVENTION

It is an object of the present invention to provide a solid-state image sensor capable of ensuring a photodetector to have a sufficiently high quantum efficiency, and also provide a method of fabricating the same.

In one aspect of the present invention, there is provided a solid-state image sensor including a photodetector array in which a plurality of photodetectors are one- or two-dimensionally arranged, each one of the photodetctors including an electrode in a photoelectric conversion region, and transmitting signals when detecting a light passing through the electrode, the solid-state image sensor converting the signals into time sequence electric signals, the electrode being composed of titanium dioxide ($TiO_2$).

It is preferable that the titanium dioxide contains oxygen vacancies and/or at least one of tungsten (W), phosphorus (P), antimony (Sb), tantalum (Ta), niobium (Nb), indium (In) and oxides thereof ($WO_3$, $P_2O_5$, $Sb_2O_2$, $Ta_2O_5$, $Nb_2O_5$, $In_2O_3$). In the latter case, doping concentration is preferably in the range of $1\times10^{19}$ cm$^{-3}$ to $1\times10^{21}$ cm$^{-3}$.

It is also preferable that the titanium dioxide is in an anatase form. For instance, the titanium dioxide may be in the form of a film having a thickness in the range of 0.1 to 2 $\mu$m.

It is preferable that the solid-state image sensor further includes an insulating film composed of PSG or BPSG and covering the titanium dioxide therewith.

It is preferable that the titanium dioxide makes electrical contact through a titanium nitride or titanium boride film with wiring metal contained in a contact hole formed through an insulating layer formed on the titanium dioxide, whereby to establish a contact structure of (wiring metal)/ $TiN/TiO_2$ or (wiring metal)/$TiB_2$/$TiO_2$.

The titanium dioxide may be in the form of a single layer, which is formed with a plurality of spaces to thereby define electrodes therebetween. A channel below the spaces is preferably doped with impurities having a conductivity type opposite to that of the channel. As an alternative, the titanium dioxide may be in the form of upper and lower layers, the lower layer being formed with a plurality of spaces to thereby define first electrodes therebetween, the first electrodes being covered with an insulating film, the upper layer being formed on the spaces of the lower layer. In this case, the insulating film may be composed of silicon dioxide or silicon nitride.

In another aspect of the present invention, there is provided a method of fabricating a solid-state image sensor, including the steps of (a) forming a titanium dioxide ($TiO_2$) film as an electrode in a photoelectric conversion region, and (b) annealing the titanium dioxide film in vacuum at a pressure of $1\times10^{-5}$ Torr or smaller at 300° C. to 1200° C.

The method may further include the steps of (c) forming an insulating film over the titanium dioxide film, (d) forming a contact hole through the insulating film, and (e) annealing the product of the step (d) at 800° C. to 1100° C. in nitrogen or boron atmosphere for altering a portion of the titanium dioxide film exposed to the contact hole into titanium nitride (TiN) or titanium boride ($TiB_2$).

There is further provided a method of fabricating a solid-state image sensor, including the steps of (a) forming a titanium dioxide ($TiO_2$) film as an electrode in a photo-electric conversion region, and (b) annealing the titanium dioxide film at 300° C. to 1000° C. in an atmosphere containing hydrogen at 10% to 100%.

There is still further provided a method of fabricating a solid-state image sensor, including the step of forming a titanium dioxide ($TiO_2$) film as an electrode in a photoelectric conversion region by sputtering, employing titanium or titanium dioxide as a target containing at least one of tungsten (W), phosphorus (P), antimony (Sb), tantalum (Ta), niobium (Nb), indium (In) and oxides thereof ($WO_3$, $P_2O_5$, $Sb_2O_5$, $Ta_2O_5$, $Nb_2O_5$, $In_2O_3$).

It is preferable that the titanium or titanium dioxide as a target contains at least one of tungsten (W), phosphorus (?), antimony (Sb), tantalum (Ta), niobium (Nb), indium (In) and oxides thereof ($WO_3$, $P_2O_5$, $Sb_2O_5$, $Ta_2O_5$, $Nb_2O_5$, $In_2O_3$) at a concentration in the range of $10^{19}$ to $10^{21}$ $cm^{-3}$.

Heretofore it has not been considered that a gate electrode or CCD transfer electrode in a photoelectric conversion region may be composed of titanium dioxide ($TiO_2$). The reason is that titanium dioxide ($TiO_2$) is an insulating material, and that though it would be possible to cause titanium dioxide ($TiO_2$) to have electrical conductivity by some methods, it does not to have sufficiently low resistivity.

Analysis of physical properties of rutile crystal which is a typical mineral of titanium dioxide ($TiO_2$) is found in the following.

1. F. A. Grant, "Properties of Rutile (Titanium Dioxide)", Reviews of Modern Physics, Vol. 31, No. 3, July 1959, pp. 646–674

2. H. Tang et al., "Electrical and optical properties of $TiO_2$ anatase thin films", Journal of Applied Physics, Vol. 75, No. 4, February 1994, pp. 2042–2047

F. A. Grant reported that rutile crystal has a characteristic of varying electrical conductivity by reduction of impurities doping. According to the report, titanium dioxide made to be electrically conductive has resistivity in the range of about $10^0$ to $10^{-1}$ Ωcm in minimum, which is higher than resistivity of polysilicon, ITO ($In_2O_3$—$SnO_2$) or tin dioxide ($SnO_2$) which is in the range of about $10^{-4}$ Ωcm.

H. Tang et al. has reported analysis about titanium dioxide ($TiO_2$) reduced into a thin film. According to the report, a thin $TiO_2$ film, in particular, one mainly in anatase form, can have resistivity lower than that of he above-mentioned rutile crystal. Even so, the resistivity is in the range of about $10^{-2}$ Ωcm, which is higher by two orders of magnitude than resistivity of polysilicon, ITO ($In_2O_3$—$SnO_2$) or tin dioxide ($SnO_2$).

As mentioned above, it is possible to cause titanium dioxide ($TiO_2$) to have electrical conductivity, however, with high resistivity. Thus, it has not been considered that a gate electrode or CCD transfer electrode in a photoelectric conversion region may be composed of titanium dioxide ($TiO_2$).

However, titanium which is a main constituent of titanium dioxide ($TiO_2$) reacts with silicon to form $TiSi_2$ which is a stable form, and has been employed as barrier metal for suppressing abnormal reaction at a contact of a semiconductor device. In addition, titanium dioxide ($TiO_2$), an oxide of titanium, has high heat resistance, high adhesion, and high processability. Furthermore, titanium dioxide ($TiO_2$) is unlikely to become contaminated unlike ITO ($In_2O_3$—$SnO_2$) and tin dioxide ($SnO_2$).

The inventor conducted an experiment in which a method of forming a thin film, usually employed in semiconductor process, was applied to titanium dioxide ($TiO_2$), and analyzed the obtained thin titanium dioxide ($TiO_2$) film. The result was that resistivity of about $10^0$ to $10^{-2}$ Ωcm was obtained in the obtained thin titanium dioxide ($TiO_2$) film by annealing in vacuum or in hydrogen atmosphere, or doping at with least one of $WO_3$, $P_2O_5$, $Sb_2O_5$, $Ta_2O_5$, $Nb_2O_5$, $In_2O_3$, and materials obtained before they are oxidized. Herein, the materials obtained before they are oxidized are equivalent to oxide doping, since W, P, Sb, Ta, Nb and In enters titanium dioxide ($TiO_2$) and combines with O in titanium dioxide ($TiO_2$).

The following has been found by experimentation. If a substrate temperature is relatively low, specifically, at room temperature (RT) to 400° C. when a thin titanium dioxide ($TiO_2$) film is formed, the anatase form is dominant in the obtained thin titanium dioxide ($TiO_2$) film. Even by carrying out annealing at relatively high temperature, specifically, at about 900° C., the anatase form is only partially phase-transferred to a rutile form. Even in annealing at a higher temperature than the above-mentioned annealing in vacuum or in hydrogen atmosphere, or in annealing in different atmosphere, it is possible to keep the resistivity almost fixed by forming a cover layer such as a silicon dioxide layer or a silicon nitride layer on the titanium dioxide ($TiO_2$) film. Hence, it has been found out that it was possible to implant impurities into silicon and activate the impurities. If the titanium dioxide ($TiO_2$) film were allowed to have a rutile form though a resistivity thereof became slightly high, the titanium dioxide ($TiO_2$) film was kept stable when heated up to about 1200° C. Such thermal stability is as good as polysilicon.

In addition, since optical band-gap of titanium dioxide ($TiO_2$) is relatively high, specifically, in the range of 3.0 to 3.2 eV, absorption loss to visible lights is quite small, and it is possible to have the same light-permeability as that of ITO ($In_2O_3$—$SnO_2$) and tin dioxide ($SnO_2$).

A first problem which would arise when an electrically conductive electrode in an integrated circuit such as a solid-state image sensor is composed of material having high resistivity is that it would be difficult to cause the electrode to have a low resistance. However, a more serious problem than the above-mentioned first problem is that it would be quite difficult or almost impossible to have a desired contact characteristic between the electrode and wiring metal. Even though an electrode was composed of high resistivity material, a resistance of an electrode may be reduced, for instance, by forming the electrode thicker, or changing a metal wiring structure. However, as a contact is formed in a smaller size, a contact area is reduced, which in turn increases contact resistance. In addition, an electrical barrier tends to be formed at a contact between wiring metal and an electrode, if the electrode is composed of high resistivity material. Thus, it is quite difficult to have the desired contact characteristic.

In a solid-state image sensor in accordance with the present invention, an electrode is formed in a photoelectric conversion region by patterning the above-mentioned thin titanium dioxide ($TiO_2$) film. It is preferable that after a contact hole leading to an electrode composed of titanium dioxide ($TiO_2$) is formed, a contact structure of (wiring metal)/TiN/TiO$_2$ or (wiring metal)/TiB$_2$/TiO$_2$ is established by altering a portion of the titanium dioxide (TiO$_2$) open to the contact hole into titanium nitride (TiN) or titanium boride (TiB$_2$). As mentioned earlier, titanium dioxide (TiO$_2$) for composing an electrode thereof in a photoelectric conversion region preferably contains oxygen vacancies, at least one of tungsten (W), phosphorus (P), antimony (Sb), tantalum (Ta), niobium (Nb), indium (In) and oxides thereof (WO$_3$, P$_2$O$_5$, Sb$_2$O$_5$, Ta$_2$O$_5$, Nb$_2$O$_5$, In$_2$O$_3$), or both oxygen vacancies and at least one of tungsten (W), phosphorus (P), antimony (Sb), tantalum (Ta), niobium (Nb), indium (In) and oxides thereof (WO$_3$, P$_2$O$_5$, Sb$_2$O$_5$, Ta$_2$O$_5$, Nb$_2$O$_5$, In$_2$O$_3$). Thus, the titanium dioxide (TiO$_2$) in the present invention has electrical conductivity, though it has also high resistivity.

Since titanium nitride (TiN) and titanium boride (TiB$_2$) altered from titanium dioxide (TiO$_2$) are metals having low resistivity, specifically, resistivity of $10^{-4}$ to $10^{-5}$ $\Omega$cm and $10^{-5}$ to $10^{-6}$ $\Omega$cm, respectively, they readily form an ohmic contact with wiring metal. In addition, since titanium nitride (TiN) and titanium boride (TiB$_2$) are altered directly from titanium dioxide (TiO$_2$), an electrical barrier is not formed between titanium dioxide (TiO$_2$) and them. Furthermore, since titanium nitride (TiN) and titanium boride (TiB$_2$) are quite stable phases, they double as a barrier metal for suppressing abnormal reaction.

The contact structure of (wiring metal)/TiN/TiO$_2$ and (wiring metal)/TiB$_2$/TiO$_2$ provide preferred contact characteristic. Accordingly, it is possible to use an electrode composed of titanium dioxide (TiO$_2$) as a gate electrode or CCD transfer electrode in a photoelectric conversion region.

Since an electrode in a photoelectric conversion region is composed of titanium dioxide (TiO$_2$), there is almost no possibility that contamination is generated unlike a conventional electrode composed of ITO (In$_2$O$_3$—SnO$_2$) and tin dioxide (SnO$_2$). No limitation is imparted to a fabrication process, in particular, an annealing step, and hence it is now possible to use both self-alignment and a highly reliable insulating film formed at high temperature conditions with the result of higher designability, performance limits, and productivity.

Additionally, titanium dioxide (TiO$_2$) has high light-permeability, and it is also possible to have a high quantum efficiency similarly to a case where an electrode is composed of transparent, electrically conductive material such as ITO (In$_2$O$_3$—SnO$_2$) and tin dioxide (SnO$_2$).

The above and other objects and advantageous features of the present invention will be made apparent from the following description made with reference to the accompanying drawings, in which like reference characters designate the same or similar parts throughout the drawings.

DESCRIPTION OF THE PREFERRED EMBODIMENTS

[First Embodiment]

Figure 1:
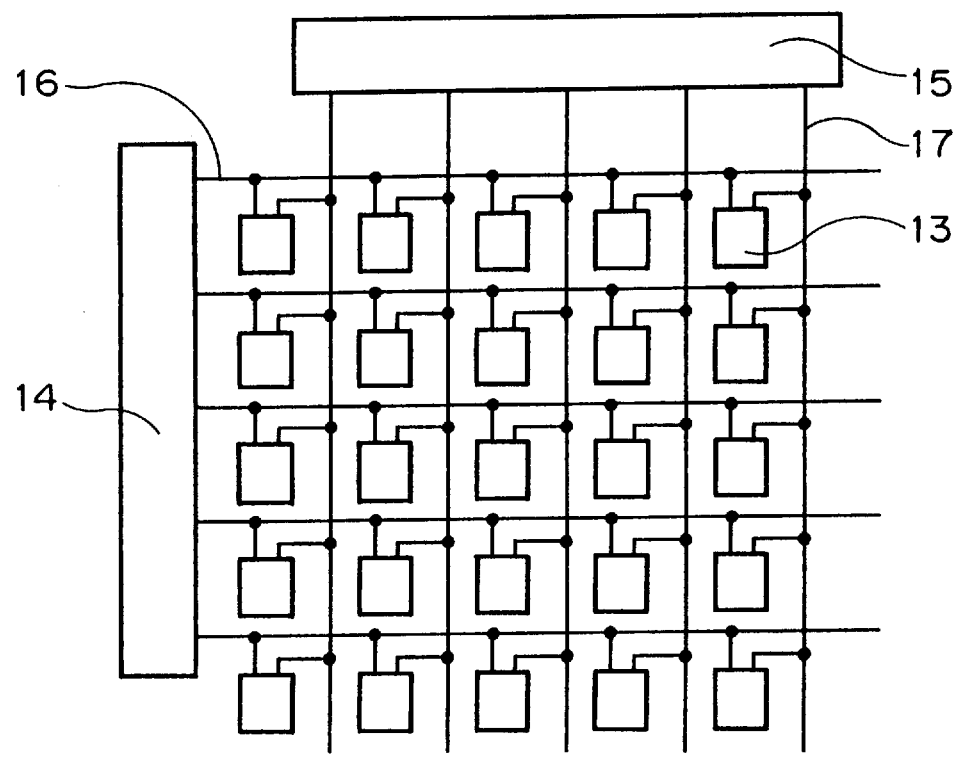
FIG. 1 is a plan view illustrating a basic structure of CID image sensor.
Figure 2A:
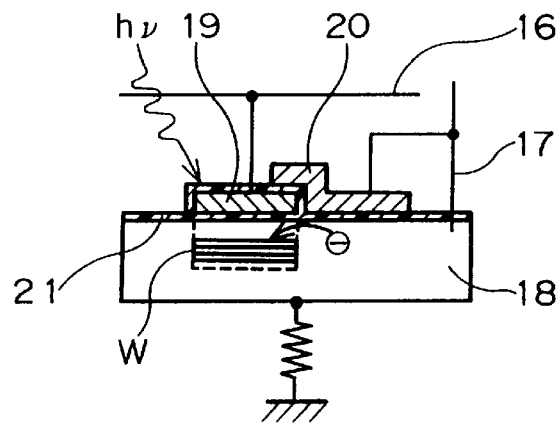
FIGS. 2A to 2C are cross-sectional views of a unit pixel in CID image sensor, illustrating an operation of the same.
Figure 2B:
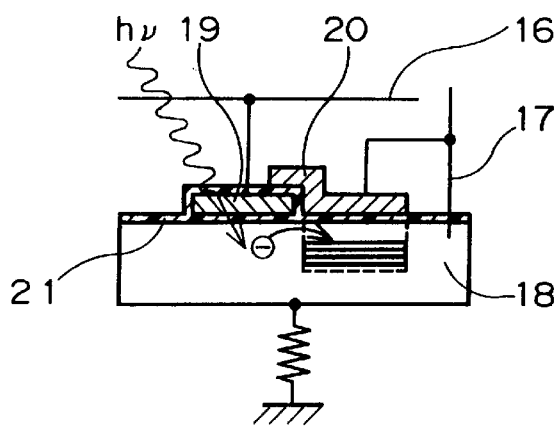
Figure 2C:
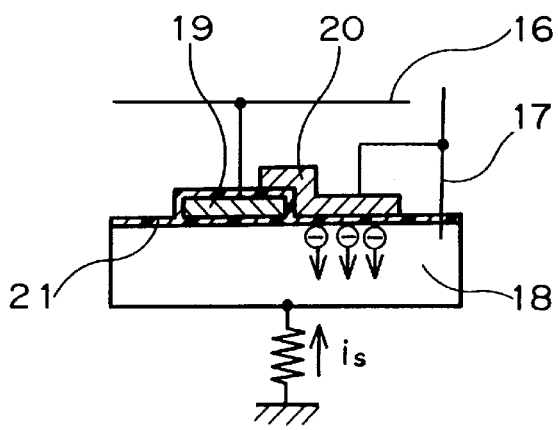
Figure 3:
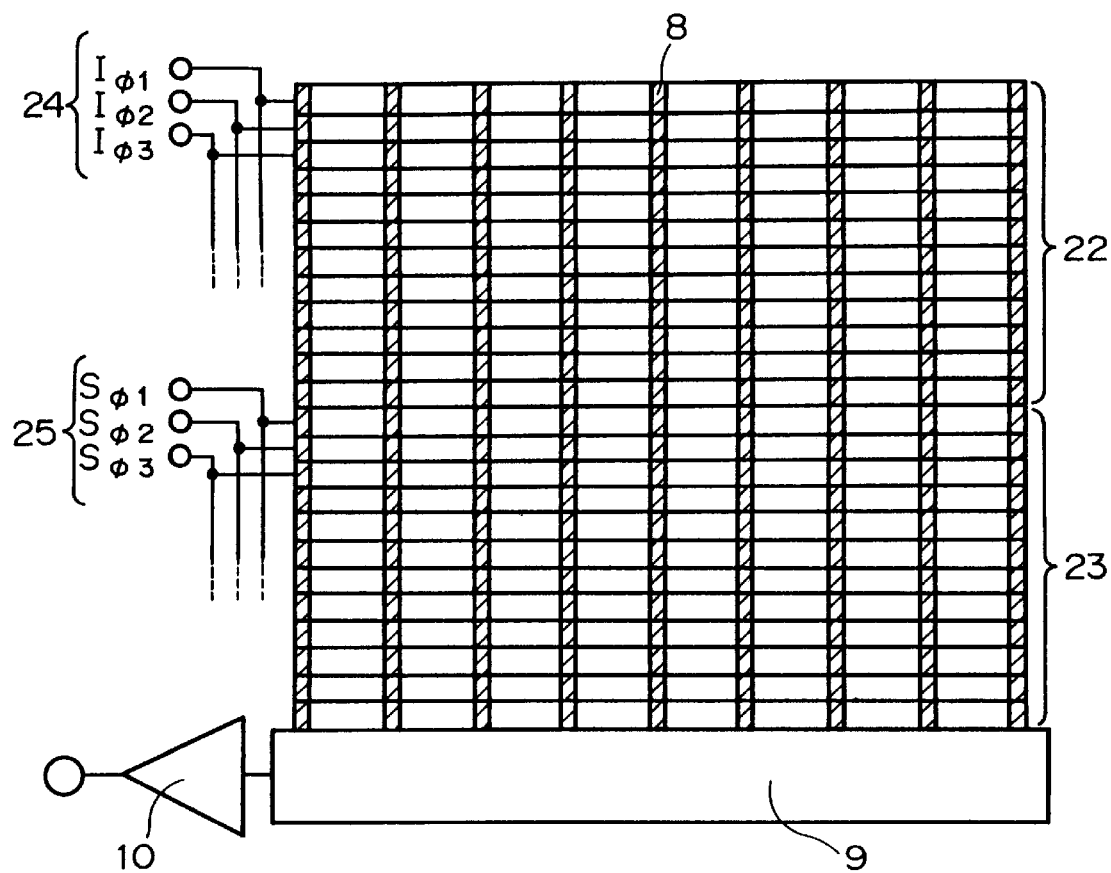
FIG. 3 is a plan view illustrating a frame transfer type CCD image sensor.
Figure 4:
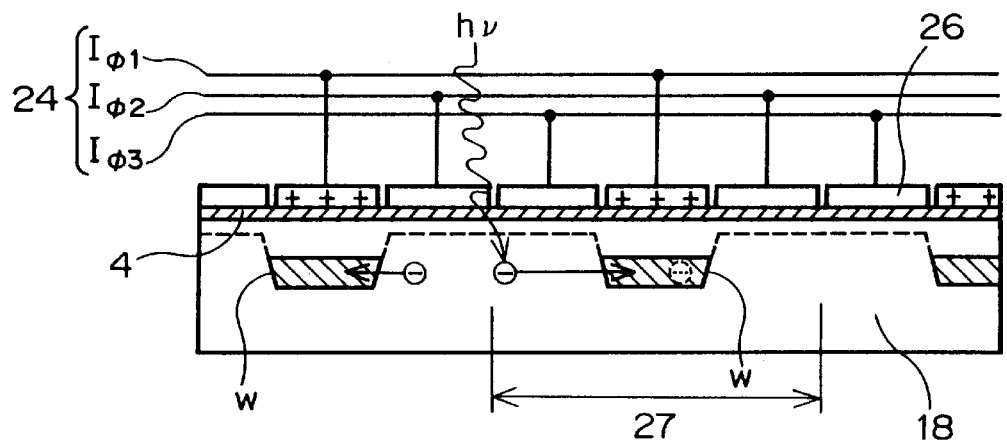
FIG. 4 is a cross-sectional view of an image section of the frame transfer type CCD image sensor illustrated in FIG. 3.
Figure 5:
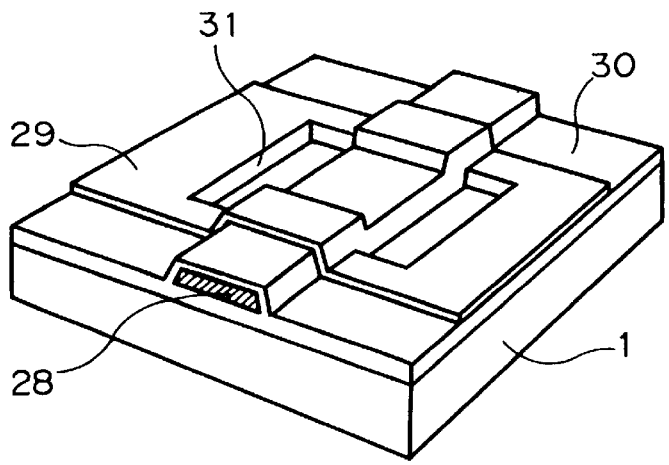
FIG. 5 is a perspective view illustrating a unit pixel of CID image sensor reported by D. M. Brown et al.
Figure 6:
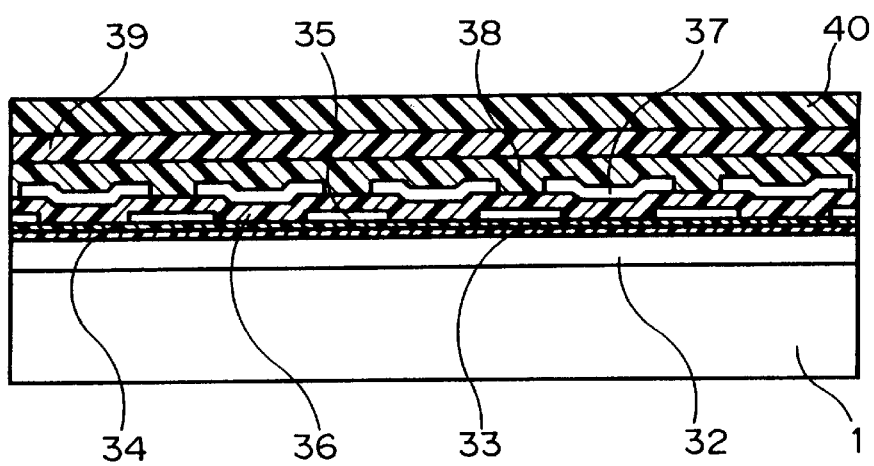
FIG. 6 is a cross-sectional view of a light-receiving region of a one-dimensional CCD, TDI operation CCD image sensor and a frame transfer type CCD image sensor reported by D. H. McCann.
Figure 7:
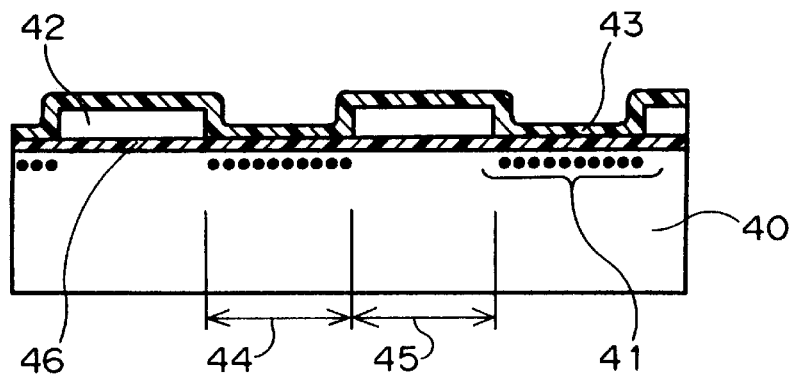
FIG. 7 is a cross-sectional view of a light-receiving region of a full-frame type CCD (virtual-phase CCD) image sensor reported by W. F. Keenan.
Figure 8:
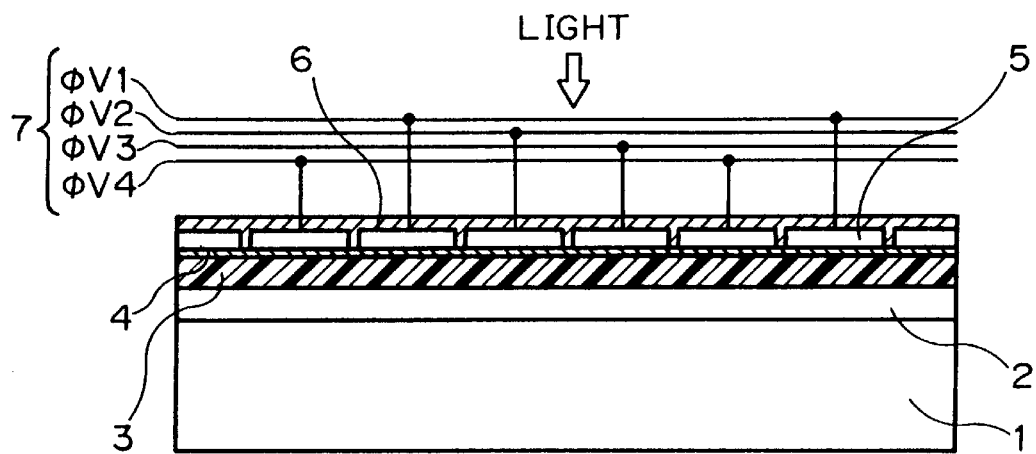
FIG. 8 is a cross-sectional view of a solid-state image sensor in accordance with a preferred embodiment of the present invention.

FIG. 8 is a cross-sectional view of a solid-state image sensor in accordance with the first embodiment. In order for the solid-state image sensor to have a vertical over flow drain structure for sweeping excessive light signal charges to a substrate, the illustrated solid-state image sensor is designed to include an n-type silicon substrate 1, a p-type well 2 formed in the n-type silicon substrate 1, and an n-type CCD channel 3 in the vicinity of a surface of the silicon substrate 1 and over the p-type well 2. For instance, the n-type silicon substrate 1 contains phosphorus at about $10^{13}$ to about $10^{15}$ cm$^{-3}$, the p-type well 2 has a depth in the range of 2 $\mu$m to 4 $\mu$m and contains boron at about $10^{15}$ to about $10^{16}$ cm$^{-3}$, and the n-type COD channel 3 has a depth in the range of 0.5 $\mu$m to 1 $\mu$m and contains phosphorus or arsenic at about $10^{16}$ to about $10^{17}$ cm$^{-3}$.

A gate dioxide film 4 is formed over the n-type CCD channel 3 by thermal oxidation. The gate dioxide film 4 has a thickness in the range of about 20 nm to about 200 nm. There may be employed a silicon nitride film, a silicon oxynitride film, or an insulating film composed of a combination of various films as a gate insulating film in place of the gate dioxide film 4. A plurality of vertical CCD electrodes 5 composed of titanium dioxide (TiO$_2$) is formed on the gate dioxide film 4. The adjacent vertical CCD electrodes 5 are spaced from each other. As mentioned later, the vertical CCD electrodes 5 are entirely covered with a cover film 6.

A titanium dioxide (TiO$_2$) film is formed by reactive sputtering in which there are used titanium as a target and sputter gas including a partial pressure of oxygen at 5 to 50%, sputtering in which titanium dioxide (TiO$_2$) is a target, or plasma-enhanced chemical vapor deposition (PCVD) employing titanium tetrachloride (TiCl$_4$) and oxygen. The titanium dioxide (TiO$_2$) film has a thickness in the range of 0.1 to 2 $\mu$m.

When many oxygen vacancies are introduced into the titanium dioxide (TiO$_2$) film for reducing resistivity, the product is annealed at a pressure of $1\times10^{-5}$ Torr or smaller, namely, at a vacuum in the order of $10^{-6}$ Torr or greater at 300° C. to 1200° C., or annealed at 300° C. to 1000° C. in hydrogen atmosphere, after the titanium dioxide (TiO$_2$) film has been formed. Herein, "hydrogen atmosphere" covers from an atmosphere established by a mixture gas of hydrogen at 10% or greater and a rare gas such as helium and argon to an atmosphere established by 100% of hydrogen. Annealing time is a few minutes to a few hours.

At least one of tungsten (W), phosphorus (P), antimony (Sb), tantalum (Ta), niobium (Nb), indium (In) and oxides thereof (WO$_3$, P$_2$O$_5$, Sb$_2$O$_5$, Ta$_2$O$_5$, Nb$_2$O$_5$, In$_2$O$_3$) may be doped into a titanium dioxide (TiO$_2$) film for reducing resistivity. As to phosphorus, antimony and indium, they may be distributed in the vicinity of a surface of the titanium dioxide (TiO$_2$) film by ion-implantation, after the titanium dioxide (TiO$_2$) film has been formed, and doped wholly into the titanium dioxide (TiO$_2$) film by annealing. However, it would be easier to prepare a titanium sputtering target or a titanium dioxide (TiO$_2$) sputtering target containing any one of the above listed impurities at $10^{19}$ to $10^{21}$ cm$^{-3}$, and dope the impurities into the titanium dioxide (TiO$_2$) film by sputtering at the same time the titanium dioxide (TiO$_2$) film is formed.

The reduction of resistivity may be insufficient by either one of the above-mentioned methods, if a diameter of crystal grain was small, since a surface condition and/or surface morphology before formation of the titanium dioxide (TiO$_2$) film exerts an influence on the diameter of crystal grain. In such a case, an increase in carriers may be facilitated by carrying out both the annealing in vacuum or in hydrogen atmosphere and the impurity doping, to thereby reduce resistivity.

After applying a photoresist mask to the thin titanium dioxide (TiO$_2$) film, the titanium dioxide (TiO$_2$) film is patterned into a vertical CCD electrode shape by dry etching. When impurities are doped into the titanium dioxide (TiO$_2$) film by ion-implantation, the above-mentioned dry etching has to be carried out after the ion-implantation. When resistivity is to be reduced by other methods than impurities doping by ion-implantation, the above-mentioned dry etching may be carried out immediately after the formation of the thin titanium dioxide (TiO$_2$) film.

An electrode may be a single layer electrode formed by etching a single, thin titanium dioxide (TiO$_2$) film to form spaces between vertical CCD electrodes, as illustrated in FIG. 8. As an alternative, an electrode may be a dual layer electrode comprising two thin titanium dioxide (TiO$_2$) films patterned into vertical CCD electrodes, with an interlayer insulating film sandwiched between the two thin titanium dioxide (TiO$_2$) films like a solid-state image sensor reported by D. H. McCann et al.

When an electrode is formed as a single layer electrode, potential loss is generated in the n-type channel 3 below spaces formed between the adjacent vertical CCD electrodes 5. Hence, in order to have a high transfer efficiency, it is necessary to dope boron, one of p-type impurities, into the spaces by self-align technique for preventing generation of potential loss. Since the vertical CCD electrodes 5 composed of titanium dioxide (TiO$_2$) are superior in thermal stability, it would be possible to ion-implant and activate boron.

After patterning the titanium dioxide (TiO$_2$) into the vertical CCD electrodes 5, boron ions are implanted into the n-type channel 13 below the spaces between the vertical CCD electrodes 5 at about 10 keV to about 100 keV in dependence on a thickness of the gate dioxide film 4 with doses of $1\times10^{10}$–$1\times10^{13}$ cm$^{-2}$ by using the vertical CCD electrodes 5 as a mask, followed by annealing over the temperature range of about 700° C. to about 1000° C. for a few minutes to a few hours in vacuum or in hydrogen atmosphere. Even if annealed at a higher temperature than that of annealing for reducing resistivity or in different atmosphere from that of annealing for reducing resistivity, the characteristics of the titanium dioxide (TiO$_2$) vertical CCD electrodes 5 are kept constant, even when the vertical CCD electrodes 5 are exposed to the atmosphere, if the TiO$_2$ vertical CCD electrodes 5 have an electrical conductivity by impurities doped thereinto. When the TiO$_2$ vertical CCD electrodes 5 have an electrical conductivity by being thermally treated in vacuum or in hydrogen atmosphere, if the impurities are annealed at a higher temperature or in different atmospheres, it is preferable to form an insulating film such as a silicon oxide film or a silicon nitride film before annealing. When the impurities are to be annealed at a temperature lower than a temperature at which the TiO$_2$ vertical CCD electrodes 5 are thermally treated for providing an electrical conductivity thereto, or when the TiO$_2$ vertical CCD electrodes 5 is to be given electrical conductivity by impurities doped thereinto, it is also preferable to form such an insulating before annealing, which enhances the quality of the insulating film by virtue of the annealing solidification effect. Since an insulating film can be solidified by being annealing after the formation of the titanium dioxide (TiO$_2$) film, even if a silicon oxide film or a silicon nitride film may be formed by low temperature process as an insulating film, it would be possible to have desired characteristics by annealing for solidification. If a silicon oxide film or a silicon nitride film may be formed by high temperature thermal CVD in which film formation temperature is about 800° C., desired characteristics of an insulating film may be obtained without annealing the film for solidification.

When an electrode is to be formed as a dual layer electrode, a lower layer is first patterned into a vertical CCD electrode shape, and then an interlayer insulating film is formed on the patterned lower layer. In accordance with the present invention, the above-mentioned silicon dioxide film or silicon nitride film formed by high temperature thermal CVD may be used as the interlayer insulating film. Since the silicon dioxide film or silicon nitride film formed by high temperature thermal CVD has insulating breakdown voltage of about $1\times10^7$ V/cm, the interlayer insulating film may be reduced in a thickness down to 20 nm, even if an insulating breakdown voltage of 20V is required between lower and upper layer vertical CCD electrodes, for instance. The interlayer insulating film doubles as a gate insulating film disposed below the upper layer vertical CCD electrodes. Since CCD would have an enhanced charge transfer ability by reducing a gate insulating film in thickness, a greater amount of transfer charges might be transferred by reducing the thickness of the interlayer insulating film. After the formation of the interlayer insulating film, the upper layer composed of titanium dioxide (TiO$_2$) is patterned into vertical CCD electrodes in the same manner as that of the lower layer vertical CCD electrodes. Thereafter, an insulating film is deposited over the upper layer vertical CCD electrodes in the same manner as that of the single-layered electrode.

After the formation of an insulating film, a surface of the device is planarized before forming an internal metal wiring layer is formed in both cases where the vertical CCD electrodes are formed as a single or dual layer electrode. The planarizing film may be composed of PSG or BPSG having a high film-quality and high reliability, which needs a planarizing temperature in the range of about 800° C. to about 1000° C.

After a surface of the device has been planarized, contact holes are formed throughout the insulating film, followed by annealing at about 800° C. to about 1100° C. in nitrogen atmosphere, to thereby smooth a shape of the contact holes and alter a portion of the titanium dioxide (TiO$_2$) vertical CCD electrodes 5 open to the contact hole into titanium nitride (TiN). As an alternative, after forming contact holes, annealing is carried out at about 800° C. to about 1100° C. in the same atmosphere as a conventional atmosphere in which boron is diffused into silicon employing argon gas as a carrier gas, to thereby smooth a shape of the contact holes and alter a portion of the titanium dioxide ($TiO_2$) vertical CCD electrodes 5 open to the contact hole into titanium boride ($TiB_2$).

Figure 11:
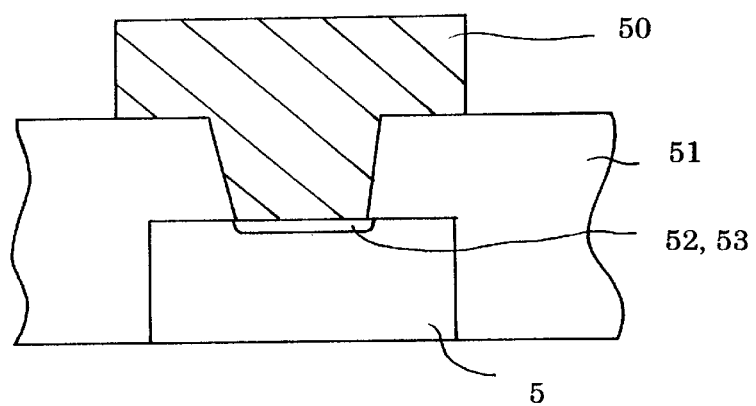
FIG. 11 is a cross-sectional view illustrating a structure of a contact between a metal wiring layer and an electrode.

Thereafter, as illustrated in FIG. 11, an internal metal wiring layer 50 is formed over the insulating film 51 so that the internal metal wiring layer 50 is contained in the contact hole. The internal metal wiring layer 50 is composed of a metal such as aluminum, copper, gold, molybdenum, and tungsten. Thus, a contact between the internal metal wiring layer 50 and the vertical CCD electrodes 5 has a structure of wiring metal 50/TiN 52/$TiO_2$ 5 or wiring metal 50/$TiB_2$ 53/$TiO_2$ 5. Since titanium nitride (TiN) and titanium boride ($TiB_2$) have resistivity lower by ordered of magnitude than that of the titanium dioxide ($TiO_2$) vertical CCD electrodes 5, specifically, resistivity in the range of $10^{-4}$ Ωcm to $10^{-5}$ Ωcm and in the range of $10^{-5}$ Ωcm to $10^{-6}$ Ωcm, respectively, they make a buffer layer forming a preferred ohmic contact with wiring metal, and in addition, they act as barrier metal for preventing abnormal reaction, ensuring desired contact characteristics. It should be noted that the contact holes and the internal metal wiring layer are formed in a region not illustrated in FIG. 8. FIG. 8 illustrates a relation between the vertical CCDs electrodes 5 and signals 7 for driving them in the case that the vertical CCDs are of four-phase drive.

Then, a metal light-shield is formed on the insulating film composed of silicon dioxide or silicon nitride in a region not illustrated in FIG. 8 for defining a light-receiving region therewith. The metal light-shield is composed of aluminum, copper, gold, molybdenum or tungsten. Then, a protection film composed of silicon dioxide, silicon nitride or other materials is formed over the device.

As is obvious from the foregoing description, the cover film 6 covering the vertical CCD electrodes 5 is comprised of the insulating film formed immediately on the titanium dioxide ($TiO_2$) vertical CCD electrodes 5, the film for planarization, the insulating formed on the internal metal wiring layer, and the protection film formed over the device. When the vertical CCD electrodes have a dual-layered structure, the cover film 6 over the lower layer vertical CCD electrodes includes an interlayer insulating film formed on the lower layer vertical CCD electrodes. If the cover film 6 is composed entirely of a silicon dioxide film (a PSG film and a BPSG film are one of silicon dioxide films), reflection at a surface of the cover film 6 can be reduced to thereby have high sensitivity by, since an index of refraction of a silicon dioxide film is about 1.45, arranging the cover film 6 to have a total thickness equal to $\lambda/5.8$ multiplied by an odd number, wherein $\lambda/5.8$ is obtained by introducing the index of refraction, 1.45, into the equation $\lambda/4n$. In the equation, $\lambda$ indicates a wavelength of a light, and n indicates an index of refraction of a film in question.

In addition, if an insulating film to be formed on the vertical CCD electrodes 5 composed of titanium dioxide ($TiO_2$) is made of a silicon nitride film, and the film (PSG or BPSG) for planaraization formed in the light-receiving region is removed by etching with the insulating film made of a silicon nitride film used as an etching stopper, it would be possible to compose the entire cover film 6 in the light-receiving region of a silicon nitride film, in which case, high sensitivity can be obtained by arranging the cover film 6 to have a total thickness equal to $\lambda/8$ multiplied by an odd number, wherein $\lambda/8$ is obtained by introducing the index of refraction of a silicon nitride film, 2, into the equation $\lambda/4n$.

If the cover film 6 was designed to have a multi-layered structure composed of a film having a low index of refraction, such as a silicon dioxide film, and a film having a high index of refraction, such as a silicon nitride film, reflection at a surface of the cover film 6 can be reduced to thereby have high sensitivity by arranging three layers in the multi-layered structure, including an air layer (n=1) and a titanium dioxide layer (n=2.0–2.8), to have a thickness as follows. Suppose that indexes of refraction of first, second and third layers in the multi-layered structure are represented with $N_1$, $N_2$ and $N_3$, respectively. When a relation among $N_1$, $N_2$ and $N_3$ is $N_1<N_2<N_3$ or $N_1>N_2>N_3$, the second layer is arranged to have a thickness equal to $\lambda/4N_2$ multiplied by an odd number. When a relation among $N_1$, $N_2$ and $N_3$ is $N_1<N_2$, $N_2>N_3$ or $N_1>N_2$, $N_2<N_3$, the second layer is arranged to have a thickness equal to $\lambda/4N_2$ multiplied by an even number.

In accordance with the above-mentioned rule, it would be preferable for the titanium dioxide ($TiO_2$) vertical CCD electrodes 5 to have a thickness equal to $\lambda/4N$ multiplied by an even number, since titanium dioxide ($TiO_2$) has a greater index of refraction than that of the gate insulating film composed of a silicon dioxide film or a silicon nitride film. It is also preferable for the gate insulating film to have a thickness equal to $\lambda/4N$ multiplied by an even number. However, if the gate insulating film became thicker to do so, a transfer ability of the vertical CCD would be degraded. Hence, it would be better in some cases to arrange the gate insulating film to have a thickness smaller than $\lambda/4N$, considering the reduction in a transfer ability of the vertical CCD, to thereby significantly reduce optical interference effect in the gate insulating film.

[Second Embodiment]

Figure 9:
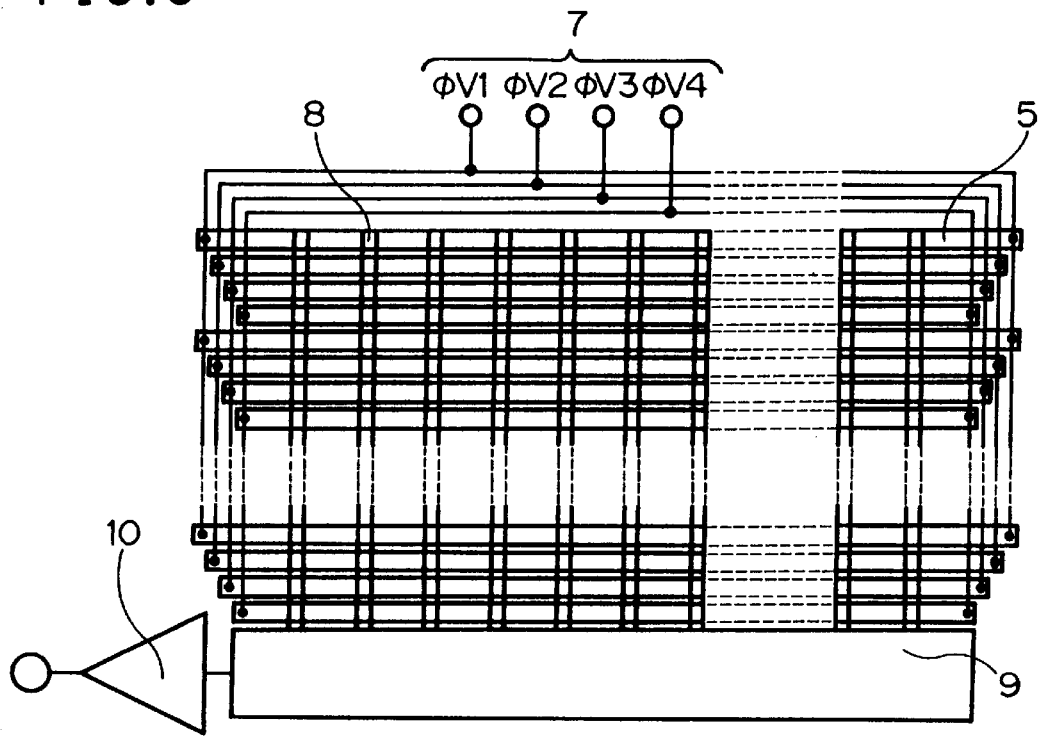
FIG. 9 is a plan view of a full-frame type CCD image sensor in accordance with a preferred embodiment of the present invention.

FIG. 9 illustrates a full-frame type CCD image sensor in accordance with the second embodiment. A plurality of $p^+$ type channel stop regions 8 divides a charge transfer channel into vertical sections to thereby define pixel rows in the number corresponding to the number of horizontal pixels. Each one of the channel stop 8 has a depth in the range of 1 μm to 4 μm, and has a boron concentration in the range of $10^{17}$ to $10^{19}$ $cm^{-3}$. A group of vertical CCDs 5 composed of titanium dioxide ($TiO_2$) is arranged perpendicularly to the channel stops 8. Signals 7 for driving the vertical CCDs 5 are transmitted to the CCD transfer electrodes 5 through left and right ends thereof The illustrated full-frame type CCD image sensor does not have a storage section unlike a frame transfer type CCD image sensor, and includes a horizontal CCD 9 connected directly to a light-receiving region composed of the vertical CCDs 5, at a termination end thereof. The horizontal CCD 9 receives signal charges at a line at a time from the light-receiving region, and transmits the thus received signal charges to an output section 10 in the form of time sequence signals. The output section 10 carries out detection of signal charges and conversion of the detected charges into voltage, and emits the signal voltage as an output.

A region other than the light-receiving region, such as the horizontal CCD 9, the output section 10 and so on, is covered with a metal light-shield. Hence, the horizontal CCD transfer electrodes and the gate electrodes in a region other than the light-receiving region may be composed of titanium dioxide ($TiO_2$) or polysilicon. The signal charges are read out by closing a mechanical shutter when optical signal charges in an image have ceased to accumulate, and then by the same steps as steps for reading out charges out of a storage section in the above-mentioned conventional frame transfer type CCD image sensor.

[Third Embodiment]

Figure 10:
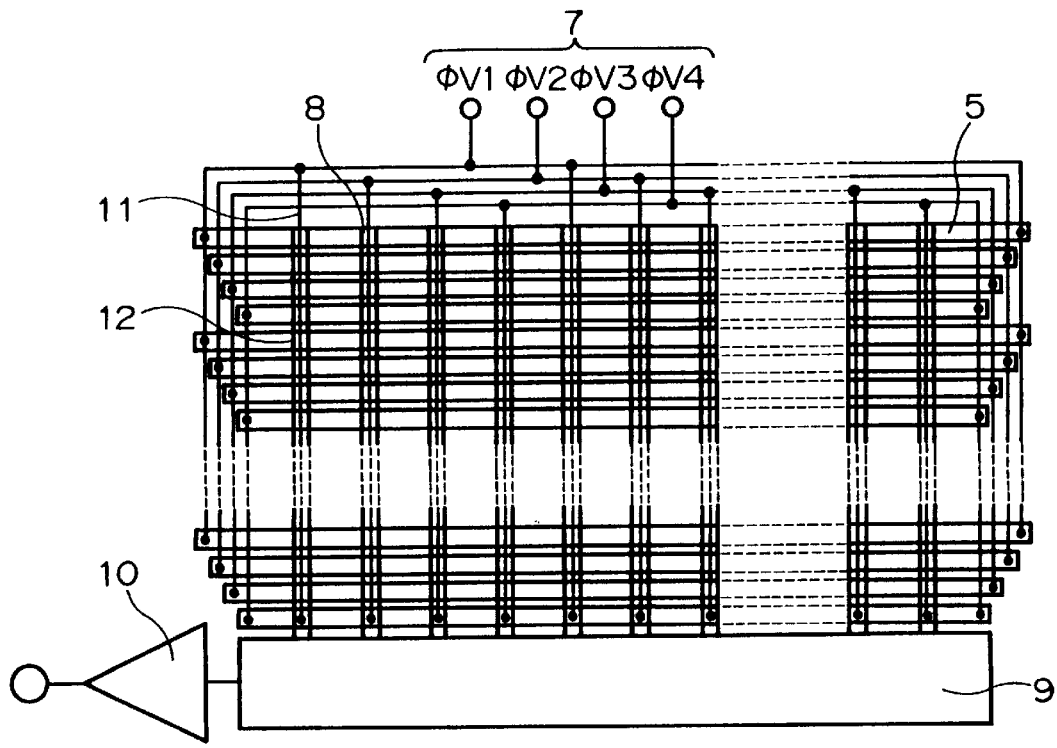
FIG. 10 is a plan view of a fill-frame type CCD image sensor in accordance with a preferred embodiment of the present invention.

FIG. 10 illustrates another full-frame type CCD image sensor in accordance with the third embodiment of the present invention. Similarly to the full-frame type CCD image sensor in accordance with the second embodiment, signals 7 for driving the vertical CCDs 5 are transmitted to the vertical CCDs 5 through left and right ends thereof. Metal wirings 11 are formed on the channel stops 8. Contacts 12 for ensuring electrical connection between the metal wirings and the electrodes 5 are offset by a distance corresponding to one stage of the vertical CCDs 5. In this embodiment, the vertical CCDs 5 are of four-phase drive, and hence, the contacts 12 are offset every four rows of the electrodes 5. The driving signals 7 are also supplied to the vertical CCDs 5 through the metal wirings 11 and the contacts 12.

In accordance with the third embodiment, a load caused by wiring resistance and vertical CCD resistance is significantly decreased when the driving signals 7 are supplied to the vertical CCDs 5. As a result, delay and decay of the driving signals 7 are prevented to thereby ensure that the full-frame type CCD image sensor in accordance with the third embodiment has a higher charge transfer ability than the second embodiment illustrated in FIG. 9.

In the above-mentioned first to third embodiments, an electrical conductivity type in each of the regions may be replaced with an opposite electrical conductivity type. Namely, a p-type conductivity may be replaced with an n-type conductivity, and vice versa. Those skilled in the art would readily understand that the present invention is able to be applied to a one-dimensional CCD, a TDI operation CCD image sensor, and a frame transfer type CCD image sensor. When a dual-layered titanium dioxide CCD electrode is to be applied to a CID image sensor, lower and upper layers are arranged perpendicularly to each other.

Hereinbelow is described an image sensor in accordance with an embodiment of the present invention and having specific dimensions.

The inventor fabricated a four-phase drive, vertical CCD type full-frame CCD image sensor having a structure as illustrated in FIG. 10 and also having effective pixels of 640 (H)×480(V). There was prepared an epitaxial silicon substrate comprising an n-type (100) silicon substrate containing phosphorus at about $2 \times 10^{14}$ cm$^{-3}$, and a 20 $\mu$m-thick epitaxial silicon layer formed on the n-type (100) silicon substrate and containing phosphorus at the same concentration. A p-type well containing boron at about $5 \times 10^{15}$ cm$^{-3}$ and having a depth of about 3 $\mu$m was formed in the epitaxial silicon substrate. Then, an n-type CCD channel containing phosphorus at about $5 \times 10^{16}$ cm$^{-3}$ and having a depth of about 1 $\mu$m was formed in the p-type well. The n-type CCD channel was perpendicularly divided into sections by channel stops arranged at a pitch of 10 $\mu$m. The channel stops had a depth of about 2 $\mu$m and contained boron at about $8 \times 10^{17}$ cm$^{-3}$.

A gate oxide film was formed over a surface of the n-type CCD channel by a thickness of 50 nm by thermal oxidation. The reason why the gate oxide film was designed to have a thickness of 50 nm is as follows. Introduction of 550 nm, which is close to the principal main wavelength in a wavelength band of visible radiation, to the equation 2 $\lambda$/4n makes 190 nm, which is relatively thick as a film thickness of a gate oxide film. Hence, the thickness 190 nm may be adopted. However, if a gate oxide film was designed to have a thickness smaller than 95 nm corresponding to $\lambda$/4n, it would be possible to enhance the capacity of the vertical CCD, and reduce interference effect with the result of smaller optical loss.

Vertical CCD electrodes composed of titanium dioxide (TiO$_2$) were formed on the gate oxide film. The titanium dioxide (TiO$_2$) vertical CCD electrodes were fabricated as follows. First, a titanium dioxide (TiO$_2$) layer was formed by reactive sputtering in which titanium was used as a target and there was employed argon gas including oxygen at a partial pressure of 30%. The thus formed titanium dioxide (TiO$_2$) layer was annealed at 500° C. for three hours in a vacuum kept in the order of 10$^{-7}$ Torr, and then dry-etched to thereby form 0.3 $\mu$m-spaces. Thus, titanium dioxide (TiO$_2$) vertical CCD electrodes were completed as a single layer electrode structure including electrodes having a width of 2.2 $\mu$m. A pixel had a dimension of 10 $\mu$m □ in the four-phase drive type vertical CCD.

After annealing in vacuum, the resistivity of the titanium dioxide (TiO$_2$) vertical CCD electrodes was $1 \times 10^{-2}$ to $2 \times 10^{-2}$ Ωcm. Resistivity almost the same as the above-mentioned one was obtained also by reactive sputtering in which titanium containing impurities such as phosphorus at about $1 \times 10^{20}$ cm$^{-3}$ was used as a target, or by sputtering in which titanium dioxide (TiO$_2$) containing impurities at the same concentration was used as a target. The vertical CCD electrodes were designed to have a thickness of 550 nm, since it had been known by measurement that an index of refraction thereof was 2.5. Herein, the thickness T of 550 nm was obtained by introducing both a wavelength $\lambda$ of 550 nm and n=2.5 into the equation T=10 $\lambda$/4n.

The n-type channel was perpendicularly implanted at 50 keV with doses of $6 \times 10^{11}$ cm$^{-2}$ boron at the spaces formed between the adjacent vertical CCD electrodes (it should be noted that ion-implantation is usually carried out at an angle of about 7 degrees from a normal line of a substrate). Then, a silicon dioxide film was formed to have a thickness of 50 nm by high temperature thermal CVD, and BPSG film was further formed on the silicon dioxide film by a thickness of 400 nm, followed by annealing for planarization at 950° C. for 30 minutes in a steam atmosphere. After contact holes had been formed through the silicon dioxide film and the BPSG film, the product was annealed at 950° C. for 30 minutes in nitrogen atmosphere to thereby smooth the shape of the contact holes, and further the surface portion of the titanium dioxide vertical CCD electrodes exposed to the contact holes was altered into titanium nitride (TiN).

Then, an internal metal wiring layer composed of aluminum was formed above the channel stops and around the light-receiving region. Then, a silicon dioxide film was formed over the internal metal wiring layer for insulation by a thickness of 400 nm by plasma-enhanced CVD. Then, a metal light-shield composed of aluminum was formed for defining the light-receiving region, and an outermost portion of the device was covered with a 200 nm-thick silicon dioxide film by plasma-enhanced CVD. As a result, the cover film formed on the titanium dioxide (TiO$_2$) vertical CCD electrodes was comprised of a silicon dioxide film having a thickness of 1050 nm which corresponds to about 11 $\lambda$/4n wherein a wavelength $\lambda$ is 550 nm. A two-phase drive type horizontal CCD and a transistor of an output section were previously formed by ordinary two-layer polysilicon process before the titanium dioxide vertical CCD electrodes had been formed. The vertical CCD and the horizontal CCD were connected with each other through dummy pixels below the metal light-shield. Then, a through-hole was formed throughout a silicon dioxide film formed on bonding pads.

The thus fabricated full-frame type CCD image sensor was operated at 30 frames per second in order to test the performance thereof. The image sensor was exposed to a light for about 16.7 milliseconds to thereby accumulate image signals, and then the mechanical shutter was closed for about 16.7 milliseconds to thereby transfer charges and output the image signals. The above-mentioned operation was repeated.

A frequency of the vertical CCD driving signals was about 30 kHz. The result was that no transfer defect was found. Since the titanium dioxide vertical CCD electrodes between the contacts arranged at a pitch of 40 µm had a significantly low resistance, specifically, in the range of about 3.3 to about 6.6 kΩ, a driving frequency is not limited by a resistance of the titanium dioxide vertical CCD electrodes and electrostatic capacity of a tiny area of the electrodes, but rather limited by a resistance of the internal metal wiring layer composed of aluminum and electrostatic capacity of the light-receiving region having a larger area and connected to the internal metal wiring layer. It was estimated that charge transfer could be carried out at a frequency up to about 20 MHz without any defect. This driving frequency is sufficiently used for high-speed transfer in a frame transfer type CCD image sensor. Quantum efficiency was equal to or greater than 60% over a visible radiation band, and was over 70% at maximum at a frequency of about 550 nm to about 600 nm.

As having been described in connection with the preferred embodiments, the solid-state image sensor in accordance with the present invention provides high quantum efficiency which would be obtained when transparent, electrically conductive material such as ITO ($In_2O_3$—$SnO_2$) and tin oxide ($SnO_2$) is used. In addition, the solid-state image sensor enhances designability, performance limits and productivity, since it has no limitation in fabrication which would exist when the above-mentioned transparent, electrically conductive material is used.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

The entire disclosure of Japanese Patent Application No. 9-24956 filed on Feb. 7, 1997 including specification, claims, drawings and summary is incorporated herein by reference in its entirety.

What is claimed is:

1. A solid-state image sensor comprising a photodetector array in which a plurality of photodetectors are one- or two-dimensionally arranged, each one of said photodetectors including an electrode in a photoelectric conversion region, and transmitting signals when detecting a light passing through said electrode,
   said solid-state image sensor converting said signals into time sequence electric signals,
   said electrode being composed of titanium dioxide ($TiO_2$), said titanium dioxide making electrical contact through a titanium nitride film with wiring metal contained in a contact hole formed through an insulating layer formed on said titanium dioxide, such that a contact structure of (wiring metal)/TiN/$TiO_2$ is established.

2. The solid-state image sensor as set forth in claim 1, wherein said titanium dioxide contains oxygen vacancies.

3. The solid-state image sensor as set forth in claim 1, wherein said titanium dioxide contains at least one of tungsten (W), phosphorus (P), antimony (Sb), tantalum (Ta), niobium (Nb), indium (In) and oxides thereof ($WO_3$, $P_2O_5$, $Sb_2O_5$, $Ta_2O_5$, $Nb_2O_5$, $In_2O_3$).

4. The solid-state image sensor as set forth in claim 2, wherein said titanium dioxide contains at least one of tungsten (W), phosphorus (P), antimony (Sb), tantalum (Ta), niobium (Nb), indium (In) and oxides thereof ($WO_3$, $P_2O_5$, $Sb_2O_5$, $Ta_2O_5$, $Nb_2O_5$, $In_2O_3$).

5. The solid-state image sensor as set forth in claim 3, wherein a doping concentration is in the range of $1\times10^{19}$ $cm^{-3}$ to $1\times10^{21} cm^{-3}$.

6. The solid-state image sensor as set forth in claim 4, wherein a doping concentration is in the range of $1\times10^{19}$ $cm^{-3}$ to $1\times10^{21}$ $cm^{-3}$.

7. The solid-state image sensor as set forth in claim 1, wherein said titanium dioxide contains anatase phase.

8. The solid-state image sensor as set forth in claim 1, wherein said titanium dioxide is in the form of a film having a thickness in the range of 0.1 µm to 2 µm both inclusive.

9. The solid-state image sensor as set forth in claim 1, wherein said titanium dioxide is in the form of a single layer, which is formed with a plurality of spaces to thereby define electrodes therebetween.

10. The solid-state image sensor as set forth in claim 1, wherein said titanium dioxide is in the form of upper and lower layers, said lower layer being formed with a plurality of spaces to thereby define first electrodes therebetween, said first electrodes being covered with an insulating film, said upper layer being formed on said spaces of said lower layer.

11. The solid-state image sensor as set forth in claim 9, wherein a channel below said spaces are doped with impurities having a conductivity type opposite to that of said channel.

12. The solid-state image sensor as set forth in claim 10, wherein said insulating film is composed of silicon dioxide or silicon nitride.

13. The solid-state image sensor as set forth in claim 1, further comprising an insulating film composed of PSG or BPSG and covering said titanium dioxide therewith.

14. A solid-state image sensor comprising a photodetector array in which a plurity of photodetectors are one- or two-dimensionally arranged, each one of said photodetectors including an electrode on a photoelectric conversion region, and transmitting signals when detecting a light passing through said electrode,
   said solid-state image sensor converting said signals into time sequence electric signals,
   said electrode being composed of titanium dioxide ($TiO_2$), said titanium dioxide making electrical contact through a titanium boride film with wiring metal contained in a contact hole formed through an insulating layer formed on said titanium dioxide, such that a contact structure of (wiring metal)/$TiB_2$/$TiO_2$ is established.

15. The solid-state image sensor as set forth in claim 14, wherein said titanium dioxide contains oxygen vacancies.

16. The solid-state image sensor as set forth in claim 14, wherein said titanium dioxide contains at least one of tungsten (W), phosphorus (P), antimony (Sb), tantalum (Ta), niobium (Nb), indium (In) and oxides thereof ($WO_3$, $P_2O_5$, $Sb_2O_5$,$Ta_2O_5$,$Nb_2O_5$, $In_2O_3$).

17. The solid-state image sensor as set forth in claim 15, wherein said titanium dioxide contains at least one of tungsten (W), phosphorus (P), antimony (Sb), tantalum (Ta), niobium (Nb), indium (In) and oxides thereof ($WO_3$, $P_2O_5$, $Sb_2O_5$,$Ta_2O_5$,$Nb_2O_5$, $In_2O_3$).

18. The solid-state image sensor as set forth in claim 16, wherein a doping concentration is in the range of $1\times10^{19}$ $cm^{-3}$ to $1\times10^{21}$ $cm^{-3}$.

19. The solid-state image sensor as set forth in claim 17, wherein a doping concentration is in the range of $1\times10^{19}$ $cm^{-3}$ to $1\times10^{21}$ $cm^{-3}$.

20. The solid-state image sensor as set forth in claim 14, wherein said titanium dioxide contains anatase phase.

21. The solid-state image sensor as set forth in claim 14, wherein said titanium dioxide is in the form of a film having a thickness in the range of 0.01 μm to 2 μm both inclusive.

22. The solid-state image sensor as set forth in claim 14, wherein said titanium dioxide is in the form of a single layer, which is formed with a plurality of spaces to thereby define electrodes therebetween.

23. The solid-state image sensor as set forth in claim 14, wherein said titanium dioxide is in the form of upper and lower layers, said lower layer being formed with a plurality of spaces to thereby define first electrodes therebetween, said first electrodes being covered with an insulating film, said upper layer being formed on said spaces of said lower layer.

24. The solid-state image sensor as set forth in claim 22, wherein a channel below said spaces are doped with impurities having a conductivity type opposite to that of said channel.

25. The solid-state image sensor as set forth in claim 23, wherein said insulating film is composed of silicon dioxide or silicon nitride.

26. The solid-state image sensor as set forth in claim 14, further comprising an insulating film composed of PSG of BPSG and covering said titanium dioxide therewith.

* * * * *